US006872880B2

(12) United States Patent
King et al.

(10) Patent No.: US 6,872,880 B2
(45) Date of Patent: Mar. 29, 2005

(54) TWO-PIECE SOLDERLESS EMC/EMI SHIELD

(75) Inventors: R. Scott King, Kokomo, IN (US); Christopher T. Tarte, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 169 days.

(21) Appl. No.: 10/463,735

(22) Filed: Jun. 17, 2003

(65) Prior Publication Data

US 2004/0256128 A1 Dec. 23, 2004

(51) Int. Cl.[7] .............................................. H05K 9/00
(52) U.S. Cl. ...................... 174/35 R; 361/816; 361/752
(58) Field of Search .......................... 174/35 R, 35 GC; 361/816, 818, 800, 752, 753

(56) References Cited

U.S. PATENT DOCUMENTS

| 5,872,332 | A | 2/1999 | Verma |
| 6,071,128 | A | 6/2000 | Brewington et al. |
| 6,137,051 | A | 10/2000 | Bundza |
| 6,191,950 | B1 * | 2/2001 | Cox et al. ................ 361/737 |
| 6,350,951 | B1 | 2/2002 | Askew |
| 6,385,048 | B2 | 5/2002 | Mellberg et al. |
| 6,549,426 | B1 | 4/2003 | Lawlyes et al. |

FOREIGN PATENT DOCUMENTS

DE   WO 91/11092   * 7/1991

* cited by examiner

*Primary Examiner*—Hung V. Ngo
(74) *Attorney, Agent, or Firm*—Stefan V. Chmielewski

(57) ABSTRACT

A two-piece electromagnetic shield includes an electrically conductive first cover and an electrically conductive second cover. The first cover has a plurality of mating protrusions approximate a lower edge of the first cover. The second cover has a plurality of mating recesses approximate a lower edge of the second cover, which each receive one of the mating protrusions of the first cover to interlock the first and second covers. The mating protrusions are formed on different first mating arms that extend from the lower edge of the first cover.

18 Claims, 2 Drawing Sheets

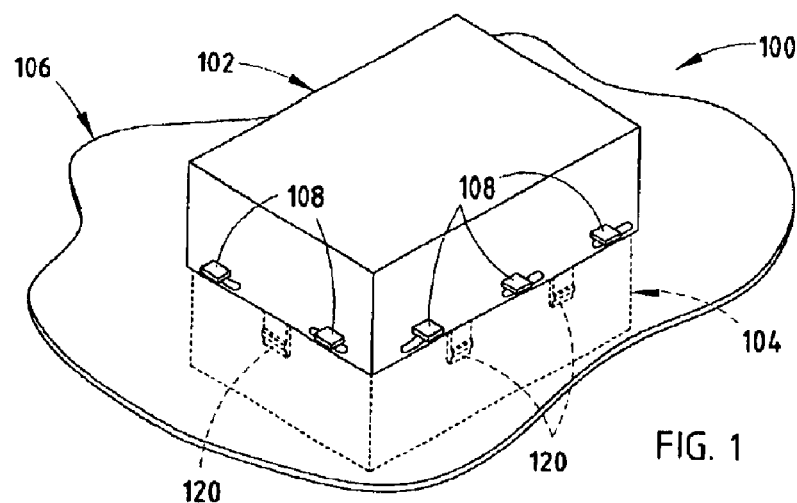
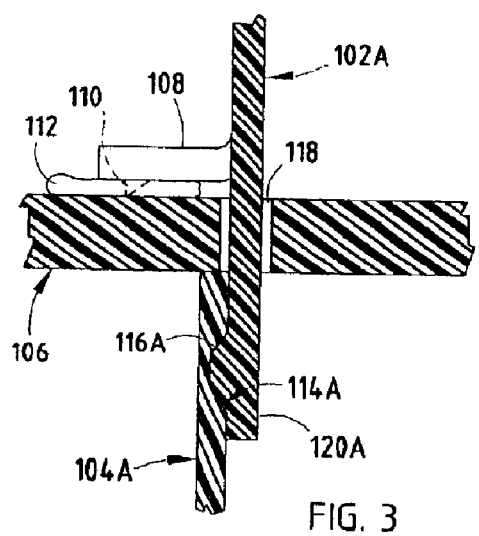
FIG. 3
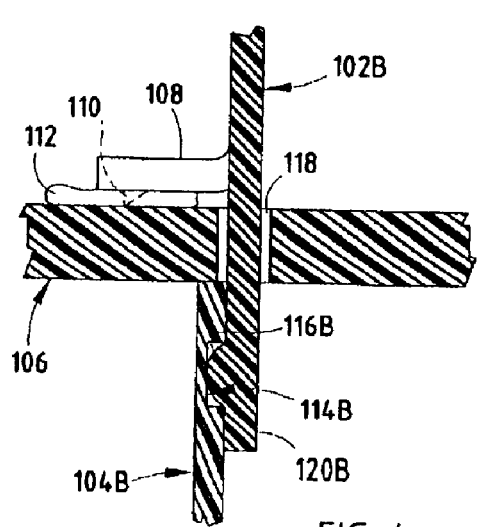
FIG. 4
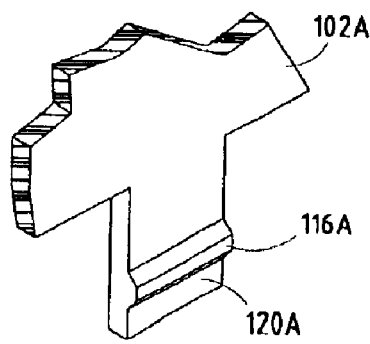
FIG. 5
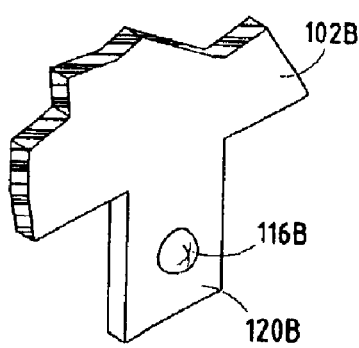
FIG. 6

TWO-PIECE SOLDERLESS EMC/EMI SHIELD

TECHNICAL FIELD

The present invention is generally directed to an electromagnetic shield and, more specifically, a two-piece electromagnetic shield.

BACKGROUND OF THE INVENTION

Typical electronic systems may implement a number of shielding techniques to shield electronic circuitry located on a printed circuit board (PCB) for electromagnetic compatibility (EMC) and/or to shield the electronic circuitry to prevent electromagnetic interference (EMI). U.S. Pat. No. 6,137,051 is directed to a two-piece EMI/EMC shield that contains a PCB. This shield includes a conductive plastic first housing portion and a conductive second housing portion. The first housing portion includes integral projecting fingers and the second housing portion has an inner surface with walls, projecting therefrom, for substantially encompassing electronic components or a portion of the electronic components mounted to the PCB. The fingers of the first housing portion surround at least a portion of the electronic components mounted on the PCB and either contact or are sufficiently close to the second housing portion to provide capacitive coupling.

The shield includes an integrated gasket, which allegedly eliminates the need to separately manufacture and separately install a gasket, thus, allegedly reducing the cost of production of the shield and the time for assembly of the shield.

Other EMI/EMC shields have been proposed or manufactured that have included shield halves, which are mounted on either side of a PCB through selective soldering and/or through the use of surface mount clips, which retain the halves of the shield. Unfortunately, such shields typically require significant processing time, capital investment and are relatively expensive.

What is needed is a relatively low-cost, manufacturable two-piece electromagnetic shield.

SUMMARY OF THE INVENTION

The present invention is directed to a two-piece electromagnetic shield that includes an electrically conductive first cover and an electrically conductive second cover. The first cover includes a plurality of mating protrusions approximate a lower edge of the first cover. The second cover includes a plurality of mating recesses approximate a lower edge of the second cover, which each receive one of the mating protrusions of the first cover to interlock the first and second covers. The mating protrusions are formed on different first mating arms that extend from the lower edge of the first cover.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which:

FIG. 1 is an assembly view of a shielded printed circuit board (PCB), according to one embodiment of the present invention;

FIG. 3 depicts a partial cross-sectional view of a shielded PCB, further depicting the interlocking of a first mating arm of a first cover with a mating recess of a second cover, according to one embodiment of the present invention;

FIG. 4 depicts a partial cross-sectional view of a shielded PCB, further depicting the interlocking of a first mating arm of a first cover with a mating recess of a second cover, according to another embodiment of the present invention;

FIG. 5 depicts a partial perspective view of the mating protrusion integrally formed on the first mating arm of the first cover, according to the embodiment of FIG. 3; and FIG. 6 depicts a partial perspective view of the mating protrusion integrally formed on the first mating arm of the first cover, according to the embodiment of FIG. 4.

DESCRIPTION OF THE PREFERRED EMBODIMENT(S)

Figure 2:
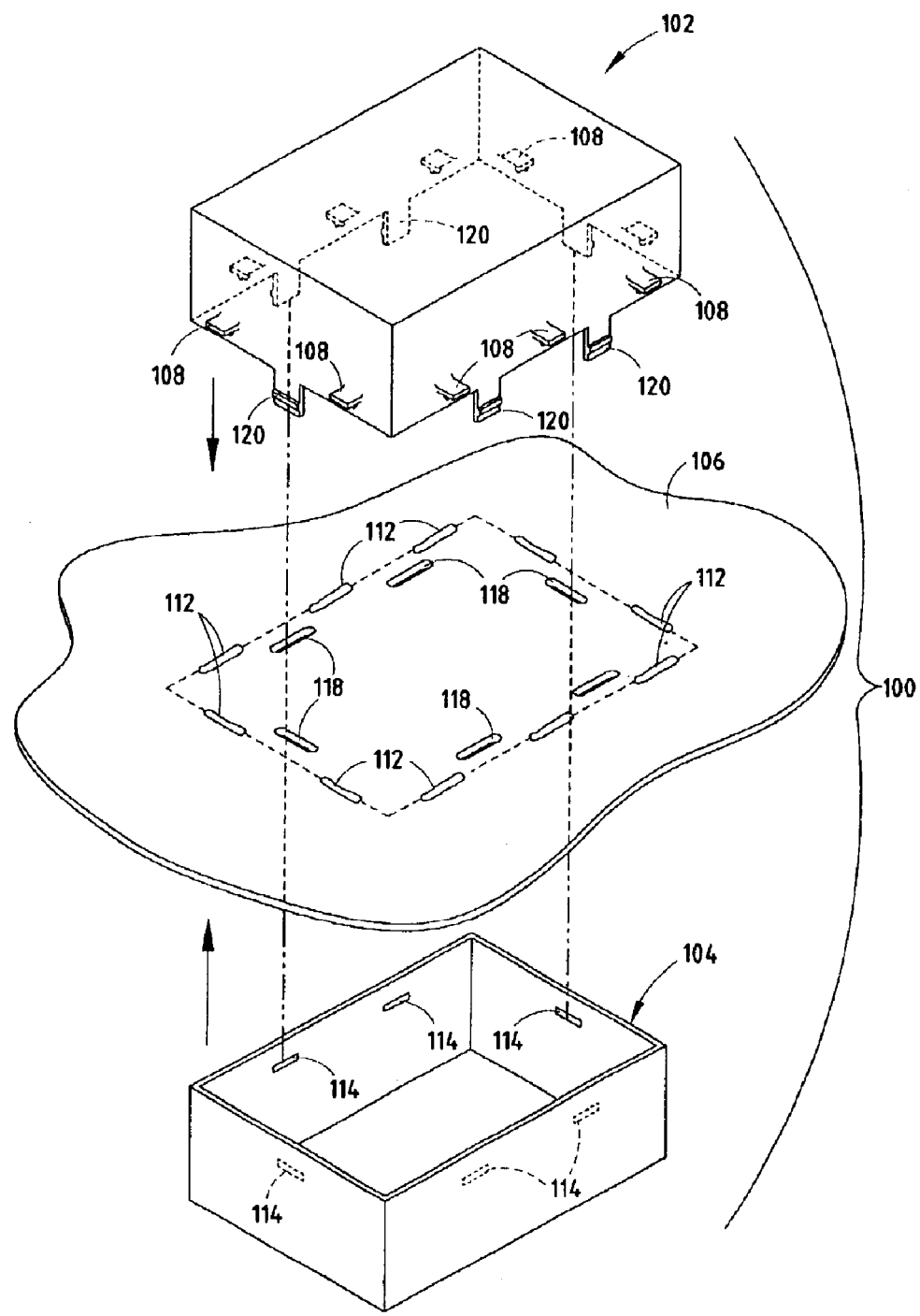
FIG. 2 is an exploded view of the shielded PCB of FIG. 1.

According to the present invention, a two-piece electromagnetic shield that snaps together and incorporates a number of unique features provides a cost-effective, manufacturable EMC/EMI shield. The two-piece electromagnetic shield includes an electrically conductive first cover and an electrically conductive second cover. The first cover has a plurality of mating protrusions approximate a lower edge of the first cover. The second cover has a plurality of mating recesses approximate a lower edge of the second cover, which each receive one of the mating protrusions of the first cover to interlock the first and second covers. The mating protrusions are each formed on different first mating arms that extend from the lower edge of the first cover.

In one embodiment, the mating recesses of the second cover are formed as apertures and the mating protrusions on the first mating arms of the first cover are formed as barbs, which interlock with the apertures of the second cover. According to the present invention, the two-piece electromagnetic shield is particularly advantageous in that non-plated mounting slots formed in a printed circuit board (PCB) can be utilized to receive the first mating arms, such that wave soldering can be performed without the requirement for masking of mounting slots, which are formed in the PCB.

According to another embodiment of the present invention, one or both of the first and second covers may include spring tabs, which provide positive grounding to conductive pads formed on the PCB. That is, the spring tabs may include a cleat that is used to dig into solder pads deposited on the PCB or into bare pads. Advantageously, these solder pads may be formed during the wave soldering or solder printing process, used for existing components. As is further described below, a plurality of conductive pads are formed on the PCB to mate with the integral cleats. It should be appreciated that the conductive pads can be formed as a continuous conductive trace. The first and second covers may be made of a variety of types of conductive material, e.g., a conductive plastic material or a metal.

As is shown in FIG. 1, a shielded PCB 100 includes an electrically conductive first cover 102, a PCB 106 and an electrically conductive second cover 104. As is also shown, a plurality of flanges (which may be formed as spring tabs) 108 are integrally formed along a lower edge of the first cover 102. As is shown in FIGS. 3 and 4, each of the plurality of flanges 108 includes a cleat 110 extending from a lower surface. It should be appreciated that the plurality of flanges 108 can be formed as a continuous flange along the lower edge of at least one of the first and second covers. In either case, the integral cleats are spaced an application appropriate distance and sized an application appropriate dimension.

As is further shown in FIG. 3, in partial cross-section, an electrically conductive first cover 102A includes a first mating arm 120A that extends through a mounting slot 118 in the PCB 106. Integrally formed on the first mating arm 120A is a mating protrusion 116A that is shaped to mate with a mating recess 114A integrally formed approximate a lower end of an electrically conductive second cover 104A. Thus, the mating arm 120A is shaped to be received by mounting slots 118, formed in the PCB 106, and interlocked with the mating recess 114A to interlock the PCB 106 between the first and second covers 102 and 104.

FIG. 5 shows a perspective view of one of the first mating arms 120A with an integral mating protrusion 116A, which is shaped to be received by the mating recess 114A. As is also shown in FIG. 3, the cleat 110, which extends from flange 108, is positioned to engage the conductive pads 112, formed on a surface of the PCB 106. It should be appreciated that flanges and integral mounting cleats can also be formed upon the cover 104A and, in this case, a plurality of corresponding conductive pads are also formed on a lower surface of the PCB 106.

FIG. 4 depicts a partial cross-sectional view of a shielded PCB, according to another embodiment of the present invention. The primary difference between the configuration of FIGS. 3 and 4 is that first mating arm 120B of first cover 102B includes a mating protrusion 116B that has a different profile than the mating protrusion 116A of FIG. 3. Similar to the aperture 118 formed in PCB 106 at FIG. 3, the aperture 118 of FIG. 4 is also configured to receive the first mating arm 120B.

FIG. 2 depicts an exploded view of the shielded PCB 100 and further details construction of the conductive pads 112, which are formed on at least one surface of the PCB 106, and the mounting slots 118 formed through the PCB 106, for receiving the first mating arms 120. As previously mentioned, the mating recesses 114 formed in the second cover 104 may take various shapes, and may be constructed as apertures to facilitate disassembly of the two-piece PCB shield, which includes the first and second covers 102 and 104.

Embodiments of the present invention are particularly advantageous when implemented within an automotive environment, where EMI/EMC shielding has become increasingly important as clock rates of various automotive electronic devices have increased.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the Doctrine of Equivalents.

What is claimed is:

1. A two-piece electromagnetic shield, comprising:
an electrically conductive first cover having a plurality of mating protrusions approximate a lower edge of the first cover; and
an electrically conductive second cover having a plurality of mating recesses approximate a lower edge of the second cover each receiving one of the mating protrusions of the first cover to inter-lock the first and second covers, wherein the mating protrusions are each formed on different first mating arms that extend from the lower edge of the first cover, and wherein a flange formed along the lower edge of at least one of the first and second covers includes a plurality of integral cleats that electrically mate with conductive pads formed on a printed circuit board PCB).

2. The shield of claim 1, wherein the mating recesses are apertures.

3. The shield of claim 1, wherein the mating protrusions are barbs and the mating recesses are apertures.

4. The shield of claim 3, wherein the first mating arms are shaped to be received by corresponding apertures in the PCB, and wherein the mating protrusions on the first mating arms extend beyond the PCB for engaging with the apertures of the second cover.

5. The shield of claim 4, wherein the apertures in the PCB are non-plated apertures.

6. The shield of claim 5, wherein the flange includes a plurality of flanges each of which include at least one integral cleat that electrically mates with a different one of the conductive pads formed on the PCB.

7. The shield of claim 6, wherein the conductive pads form an interconnected conductive trace.

8. The shield of claim 1, wherein the conductive pads form a conductive trace.

9. The shield of claim 1, wherein the first and second covers are made of one of a conductive plastic material and a metal.

10. A shielded printed circuit board, comprising:
a printed circuit board (PCB) including a plurality of mounting apertures;
an electrically conductive first cover having a plurality of first mating arms that extend from a lower edge of the first cover, wherein each of the first mating arms includes a mating protrusion, and wherein the first mating arms are shaped to be received by the apertures in the PCB and sized such that the mating protrusions extend beyond the PCB; and
an electrically conductive second cover having a plurality of mating recesses approximate a lower edge of the second cover and each receiving one of the mating protrusions of the first cover to inter-lock the PCB between the first and second covers and provide electromagnetic shielding for at least one electrical component located on the PCB within the first and second covers, wherein a flange formed along the lower edge of at least one of the first and second covers includes a plurality of integral cleats that electrically mate with conductive pads formed on the PCB.

11. The shielded printed circuit board of claim 10, wherein the conductive pads form an interconnected conductive trace.

12. The shielded printed circuit board of claim 10, wherein the mating protrusions are barbs and the mating recesses are apertures.

13. The shielded printed circuit board of claim 12, wherein the apertures in the PCB are non-plated apertures.

14. The shielded printed circuit board of claim 13, wherein the flange includes a plurality of flanges each of which include at least one integral cleat that electrically mates with a different one of the conductive pads formed on the PCB.

15. The shielded printed circuit board of claim 14, wherein the conductive pads form an interconnected conductive trace.

16. The shielded printed circuit board of claim 10, wherein the first and second covers are made of one of a conductive plastic material and a metal.

17. A two-piece electromagnetic shield, comprising:
- an electrically conductive first cover having a plurality of mating protrusions approximate a lower edge of the first cover; and
- an electrically conductive second cover having a plurality of mating recesses approximate a lower edge of the second cover each receiving one of the mating protrusions of the first cover to inter-lock the first and second covers, wherein the mating protrusions are each formed on different first mating arms that extend from the lower edge of the first cover, and wherein the first and second covers are made of one of a conductive plastic material and a metal, where a flange formed along the lower edge of at least one of the first and second covers includes a plurality of integral cleats that electrically mate with conductive pads formed on a printed circuit board (PCB).

18. The shield of claim 17, wherein the first mating arms are shaped to be received by corresponding apertures in the PCB, and wherein the mating protrusions on the first mating arms extend beyond the PCB for engaging with the mating recesses of the second cover.

* * * * *